United States Patent [19]

Beitner

[11] Patent Number: 4,627,242

[45] Date of Patent: Dec. 9, 1986

[54] THERMOELECTRIC COOLER

[75] Inventor: Shlomo Beitner, Tel-Aviv, Israel

[73] Assignee: Vapor Corporation, Chicago, Ill.

[21] Appl. No.: 601,994

[22] Filed: Apr. 19, 1984

[51] Int. Cl.[4] .......................................... F25B 21/02
[52] U.S. Cl. ........................................................ 62/3
[58] Field of Search ............................................ 62/3

[56] References Cited

U.S. PATENT DOCUMENTS

| | | | |
|---|---|---|---|
| 3,209,547 | 10/1965 | Elfving | 62/3 |
| 4,326,383 | 4/1982 | Reed et al. | 62/3 |
| 4,383,414 | 5/1983 | Beitner | 62/3 |
| 4,400,948 | 8/1983 | Moorehead | 62/3 |

Primary Examiner—Lloyd L. King
Attorney, Agent, or Firm—Francis J. Lidd

[57] ABSTRACT

A thermoelectric cooler of rugged construction for use in cabs of a railway locomotive includes a housing with a storage compartment mounted therein surrounded by insulation. The compartment is fabricated of thermoconductive material and includes flat sides without protuberances. A plurality of thermoconductive coupling blocks are secured to the sides of the compartment. A thermoelectric module of substantially the same size as the coupling pad is secured to each pad with the cold face of the module against the pad. An extruded aluminum heat exchanger with a plurality of parallel fins is secured to the hot side of each thermoelectric module to draw off heat and dissipate it to the surrounding environment. The fins are spaced apart a predetermined, optimum distance to obtain maximum heat transfer. A support and spot shim are employed to secure each heat exchanger to a coupling pad. Each coupling pad, thermoelectric module and heat exchanger are secured to the storage compartment by fasteners. Each fastener is insulated by an insulating bushing and one or more Belleville washers are mounted on each fastener to compensate for thermal cycling of the assembly due to environmental temperature changes.

8 Claims, 8 Drawing Figures

THERMOELECTRIC COOLER

BACKGROUND OF THE INVENTION

1. Field of the Invention

The present invention relates to coolers, and particularly to thermoelectric coolers used in locomotive cabs which do not require massive plates or protuberances for mounting the thermoelectric modules.

2. Description of the Background Art

Cabs of locomotives present a particularly harsh environment for coolers used to cool food items, water and beverages. The operating temperature in these cabs is exceedingly high. Space in these cabs is at a premium and there is substantial vibration. In this environment a solid state cooler such as disclosed in U.S. Pat. No. 4,383,414 has proven satisfactory. Since there is significant heat transfer that must occur in coolers in this environment, the cooler of the '414 patent includes massive plates and stacked, external heat sinks. These plates and heat sinks require substantial space in the already limited space of the cab.

Thermoelectric coolers or solid state coolers are low efficiency and the design of the heat exchanger/thermoelectric module interface and of the storage compartment/thermoelectric module interface is crucial. These interfaces in the '414 device are of less than satisfactory efficiency and it is desirable to improve this efficiency.

SUMMARY OF THE INVENTION

An object of the present invention is to provide a new and improved cooler for locomotive cabs and similar environments.

Another object of the present invention is to provide a new and improved cooler that uses thermoelectric modules to cool a storage compartment.

A further object of the present invention is to provide a new and improved thermoelectric cooler with efficient thermoelectric/storage compartment interfaces.

A still further object of the present invention is to provide a new and improved thermoelectric cooler with space saving, efficient heat exchangers.

Another object of the present invention is to provide a new and improved coupling pad for mounting thermoelectric modules onto a storage compartment.

Briefly, the present invention is directed to a new and improved cooler and particularly to a new and improved thermoelectric cooler for locomotive cabs and similar environments. The cooler includes a housing in which a storage compartment is mounted encased by insulation. The compartment is fabricated of thermoconductive material. A predetermined number of thermoelectric modules are mounted on the outer peripheral surface of the compartment by coupling pads. The pads are approximately the same size as the thermoelectric modules and are fabricated of thermoconductive material.

A heat exchanger of extruded aluminum with parallel, vertically disposed fins of predetermined spacing is secured to each coupling pad by one or more fasteners, a support bar and spot shim. To thermally insulate the fasteners, insulating bushings may be mounted around the fasteners. To compensate for temperature changes, Belleville washers are placed on the fasteners.

BRIEF DESCRIPTION OF THE DRAWINGS

The above and other objects and advantages and novel features of the present invention will become apparent from the following detailed description of a preferred embodiment of the invention illustrated in the accompanying drawings wherein.

DESCRIPTION OF THE PREFERRED EMBODIMENT

Figure 1:
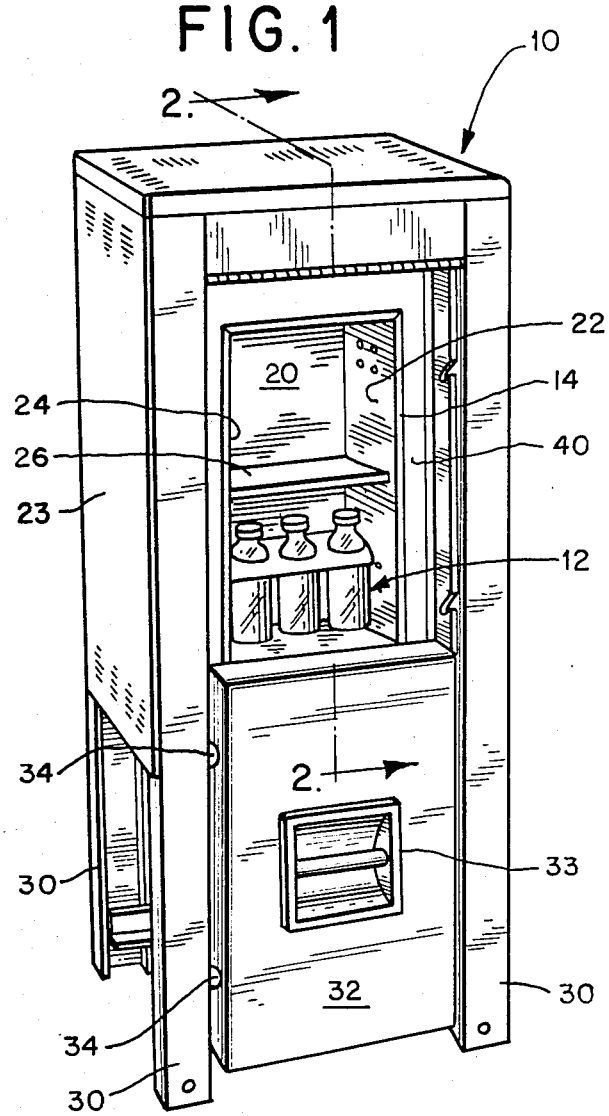
FIG. 1 is a perspective view of a cooler constructed in accordance with the principles of the present invention.

Referring to the drawings and particularly to FIG. 1, there is illustrated a cooler generally designated by the reference numeral 10 constructed in accordance with the principles of the present invention. Cooler 10 is compact in size and of rugged construction allowing it to be used in warm environments and confined spaces such as cabs of locomotives. Cooler 10 may be employed to store food or beverages such as beverages 12 and keep these items cool until consumption.

The beverages 12 are stored in a storage compartment 14 fabricated of thermoconductive material and may be of one piece, or multi piece construction including a top 16, a bottom 18, a back wall 20 and side walls 22 and 24. Compartment 14 is open in the front allowing access to the interior and may include up to three shelves.

Compartment 14 is mounted within a cooler housing 28 which is supported on four legs 30. Housing 28 is slotted to allow the flow of air into housing 28 and around heat exchanger 60 to enhance the exchange of heat by said heat exchanger 60 to be described hereinafter.

The open front of compartment 14 is covered by a door 32. Door 32 includes a handle 33 and transverse rods (not shown) that ride in slots or grooves 36 formed in housing 28 as more fully described in U.S. Pat. No. 4,383,414. Rollers 34 mounted in uprights 50 guide door 34 during vertical movement in opening and closing said door. A somewhat similar structure of the housing 28 is also described in U.S. Pat. No. 4,383,414, and this patent is incorporated by reference herein.

To insulate compartment 14 from the surrounding environment, it is encased in insulating foam 38 such as polyurethane foam. Foam 38 is secured in position by an effectively continuous containment or housing 40, formed of sheet metal or the like and held within housing 28 by angle mounts 42 (FIG. 2) that are anchored to housing 28.

Since cooler 10 is intended to be used in environments subject to substantial vibration, it is desirable to employ means to cool compartment 14 that can withstand vibration. Systems that employ refrigeration cooling coils or similar fragile devices have deomonstrated relatively poor reliability. However, it has been shown that thermoelectric modules can provide cooling with improved device reliability, and withstand vibration.

In view of the dependence of thermoelectric modules on heat dissipation in the hostile environment of a locomotive cab, however, it is important to provide optimum thermomechanical interfaces at the modules and to place the modules at locations on compartment 14 to insure the desired level of cooling. To allow optimal placement of the thermoelectric modules 44 of the present invention onto compartment 14, individual coupling pads 46 are provided.

Figure 6:
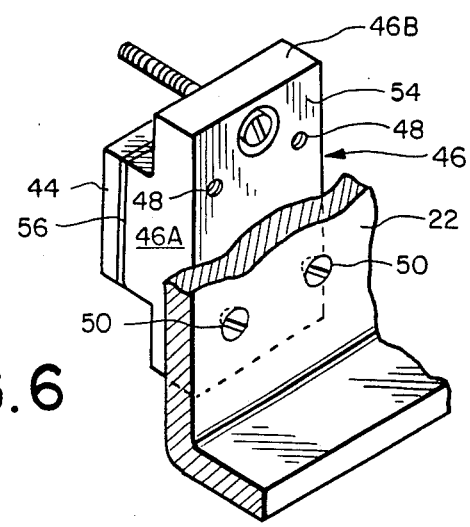
FIG. 6 is a partial, cut away view of a coupling pad illustrating mounting of the coupling pad to a wall of the storage compartment.

Coupling pads 46 are fabricated of thermoconductive material and are substantially the size of the modules 44 and allow connection of electric energy to leads 45 of modules 44 outside the surrounding insulation 38. Coupling pads 46, in the preferred embodiment illustrated, are T-shaped with a central block portion 46A and perpendicular arms 46B. Block portion 46A provides a surface for mounting thermoelectric modules 44 and arms 46B provide a mounting surface described hereinafter. Individual pads 46 replace the integral massive plates and integral T-bars in presently used coolers. Pads 46 include apertures 48 (FIG. 6) for the securement of the pads 46 to the compartment 14 by fasteners 50. It can be seen that the size of the pads 46 and the manner of mounting them to compartment 14 allow ease in placement of the pads 46 and thus modules 44 at optimal locations on compartment 14.

Figure 7:
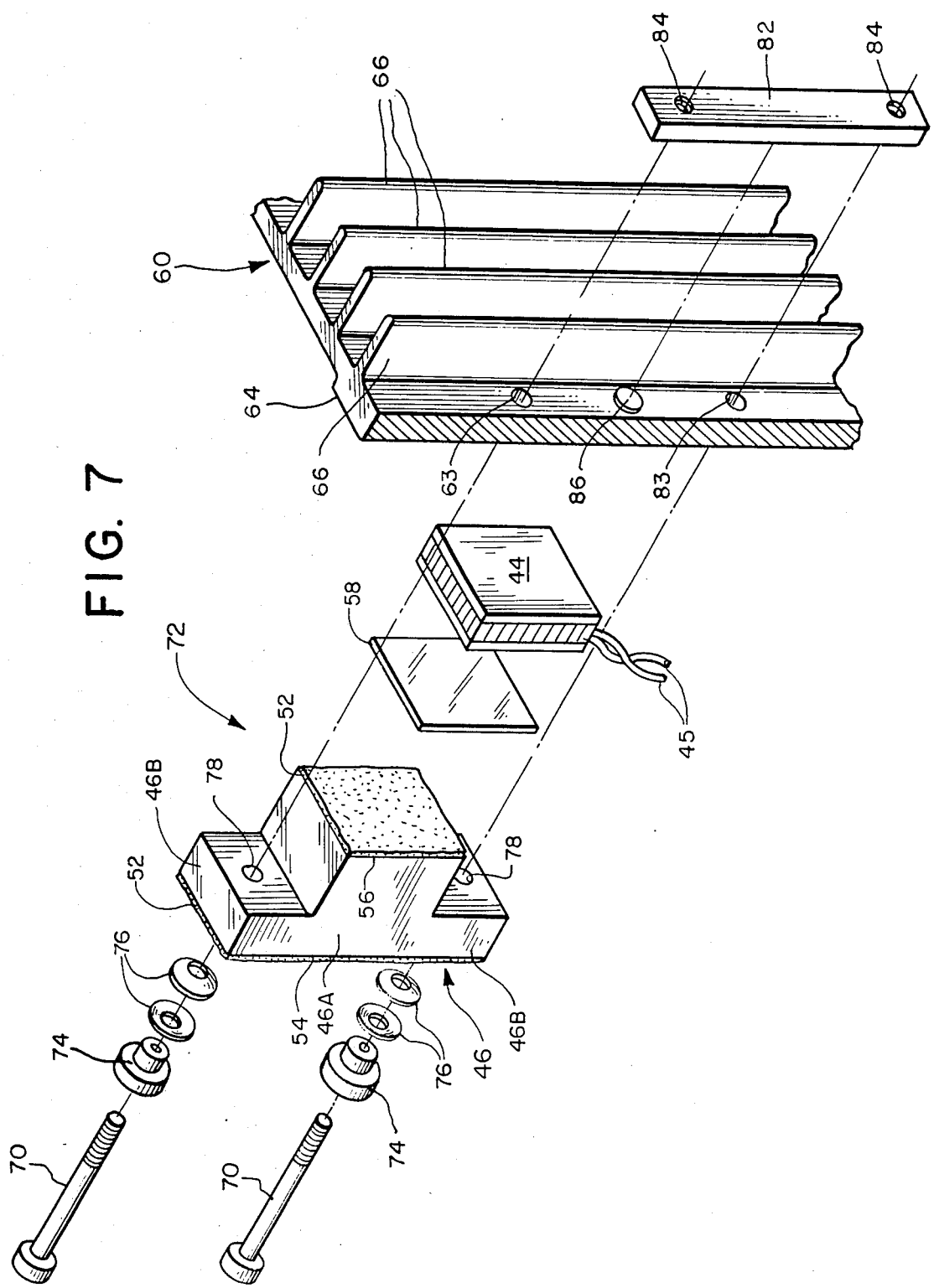
FIG. 7 is an exploded view of the coupling pad, thermoelectric module and heat exchanger with the mounting structure of the present invention.

To enhance thermoconduction, layers of conductive grease 52 are applied to the rear surface 54 and front surface 56 of each coupling pad 46 (FIG. 7). A thermoelectric module 44 is mounted with the cold face adjacent front surface 56 of pad 46. To insulate the pads 46 and thus compartment 14 electrically from modules 44, a Mylar insulating shim 58 is positioned between each pad 46 and module 44.

Figure 2:
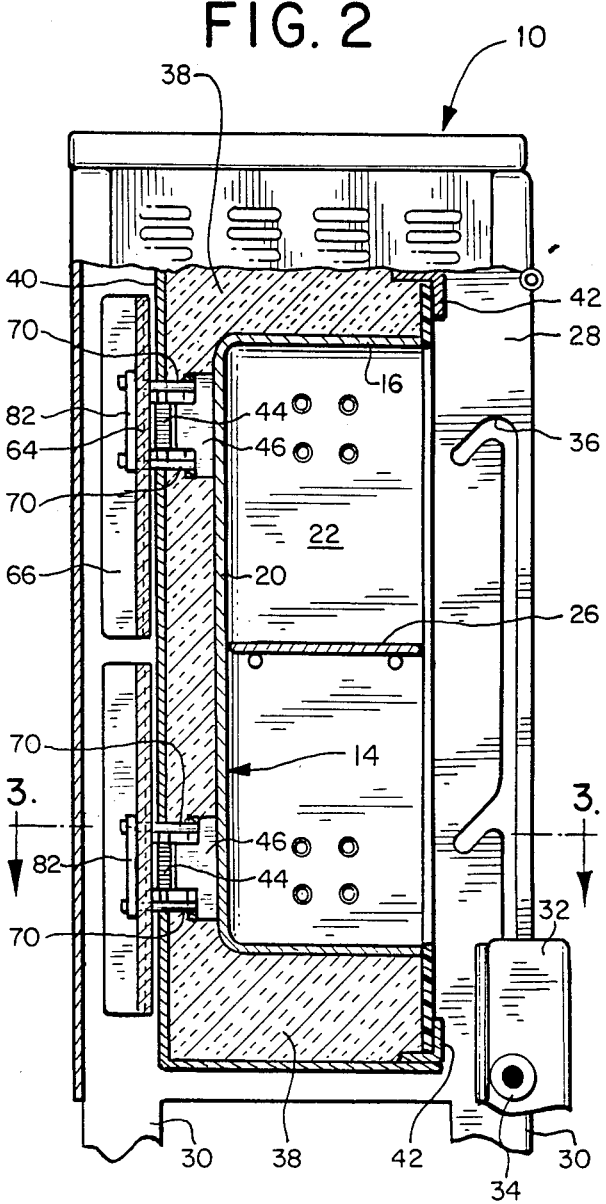
FIG. 2 is a view taken generally along line 2—2 of FIG. 1.
Figure 3:
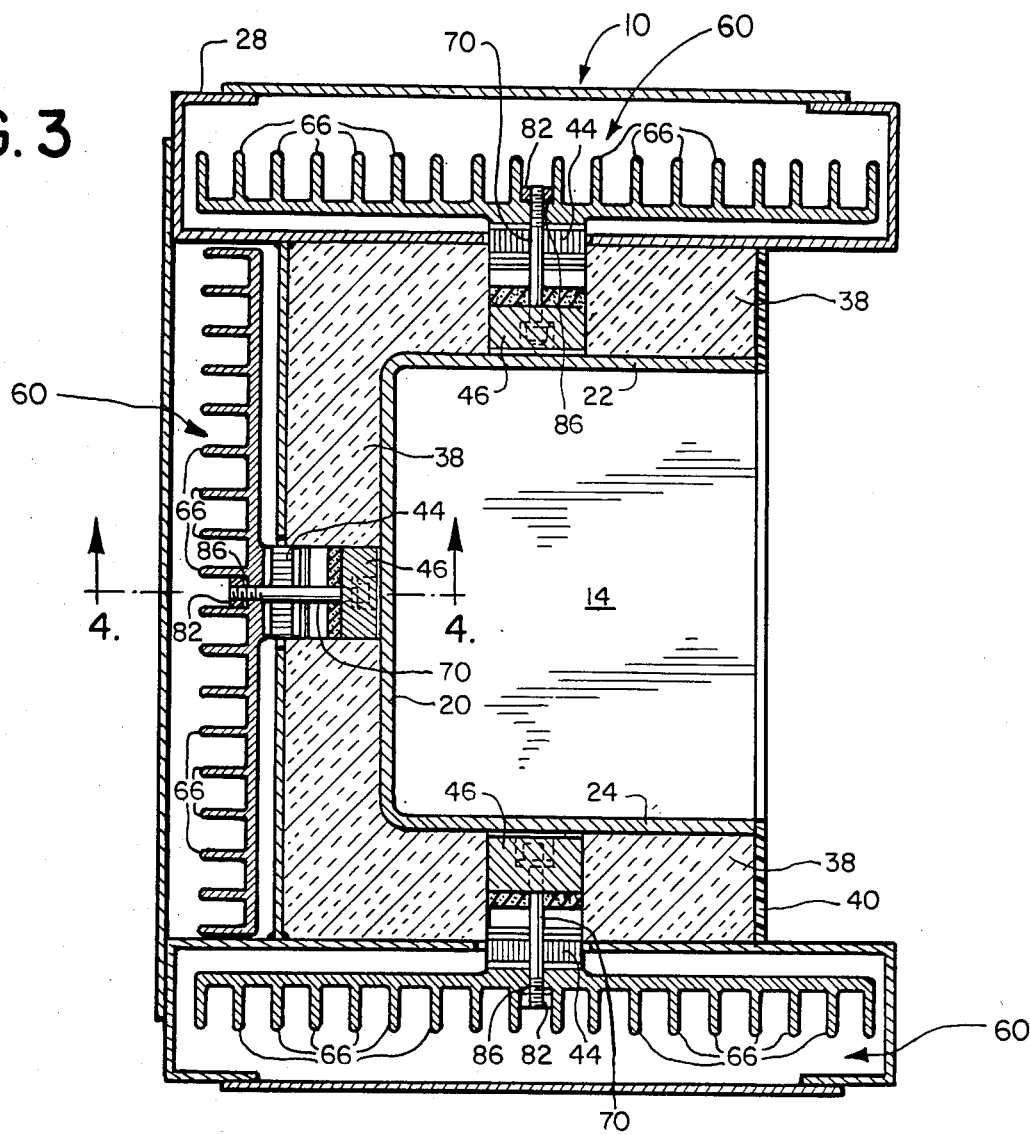
FIG. 3 is a view taken generally along line 3—3 of FIG. 2.
Figure 4:
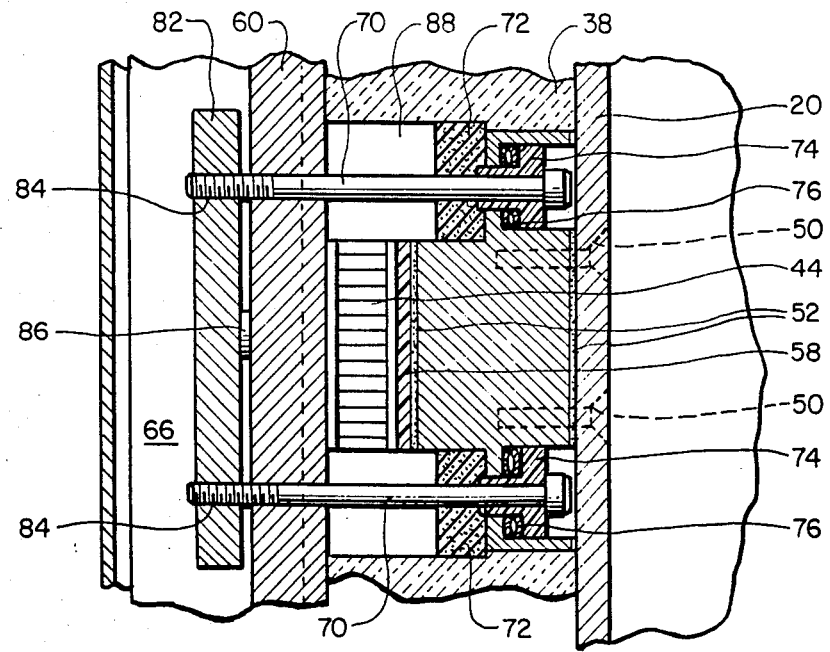
FIG. 4 is a view taken generally along line 4—4 of FIG. 3.
Figure 5:
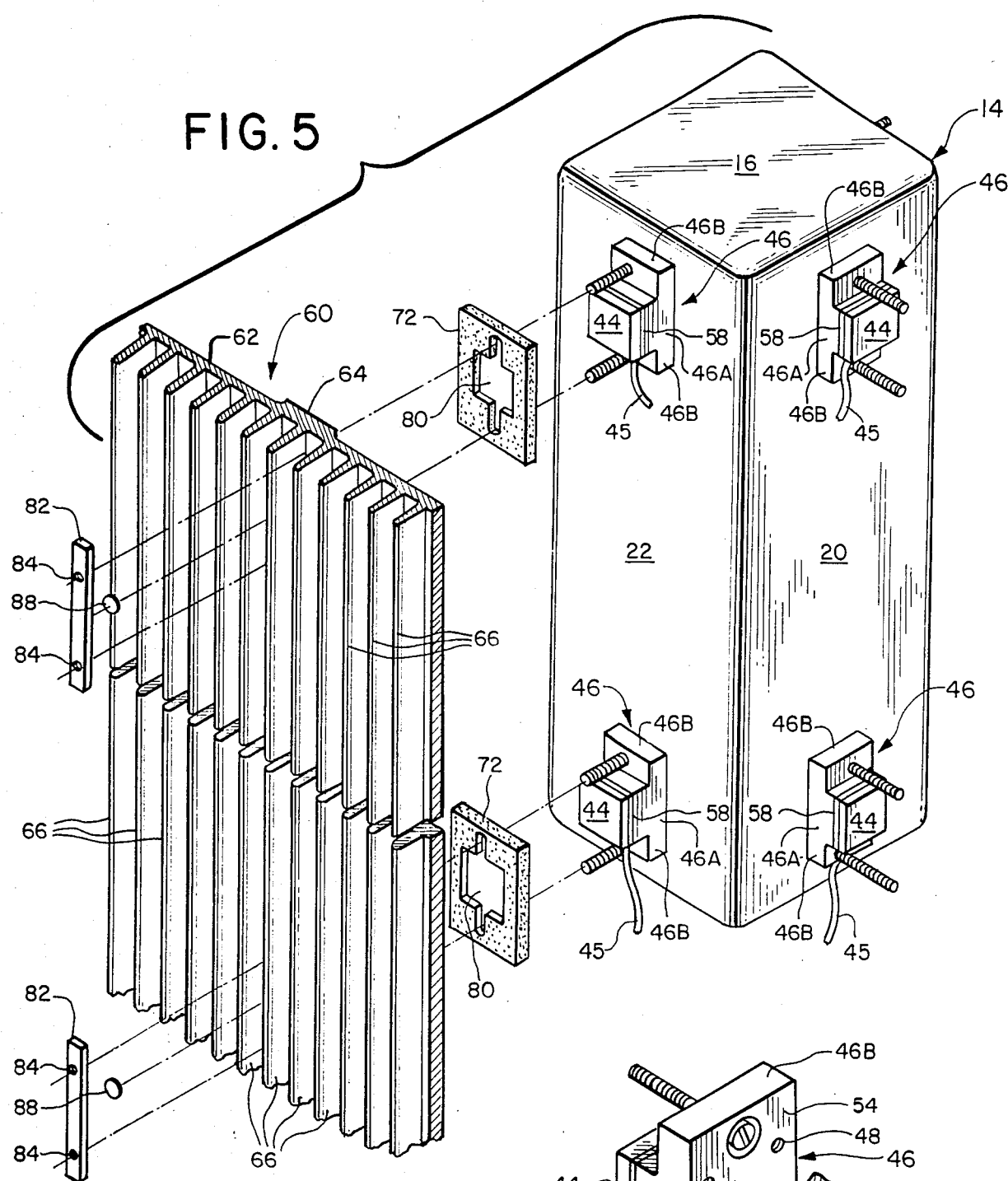
FIG. 5 is a perspective, exploded view of the storage compartment, heat exchanger and coupling pad of the present invention.

To dissipate heat energy from each module 44 to the surrounding environment, a heat exchanger 60 is mounted on the hot face of each module 44. Each heat exchanger 60 is positioned within an area enclosed by the housing 28 and frame 40 (FIGS. 2-4). Since housing 28 is vented through slots, air circulates around the heat exchangers 60 dissipating heat to the atmosphere.

Each heat exchanger 60 is preferably of extruded aluminum with a base 62 including a mounting pad 64 that abuts the hot face of a module 44. On the side of base 62 opposite pad 64 there are formed a plurality of parallel fins 66 that are spaced an optimum critical distance "X" (FIG. 7) for the most efficient heat exchange rate. Applicant has discovered that vertically oriented finned exchanger of this type and application have improved dissipation if fin spacing of 0.5 inches is maintained. In keeping with an important feature of the invention, fins 66 are vertically aligned providing increased rigidity to the heat exchanger 60, as mounted.

In the preferred embodiment illustrated, each heat exchanger 60 includes a pad 64 with apertures 68 above and below each pad 64 in vertical alignment allowing alignment of mounting fasteners 70 between vertical fins 66. A heat exchanger 60 and module 44 are secured to a coupling pad 46 and to compartment 14 by fasteners 70. A resilient gasket 72 is first placed on coupling pad 46. Insulating bushings 74 are placed around each fastener 70 to avoid a thermal short circuit between fasteners 70 and coupling pads 46. Belleville washers 76 are also positioned on each fastener 70 to provide proper mechanical compression between the coupling pad 64, module hot face 44, module cold face 46A, and pad 46. Compensation for thermal cycling of the module assembly is also provided. Fasteners 70 and bushings 74 are passed through apertures 78 in arms 46B of coupling pads 46, through cut outs 80 in gaskets 72 and through apertures 68 in heat exchangers 60. Vertical orientation of the heat exchanger fins 66, and positioning of fasteners 70 greatly "stiffens" the heat exchanger thermal coupling surface 64, thereby minimizing the tendency to bow when fasteners 70 are properly tensioned. This feature greatly improves heat transfer between module hot face 44 and heat exchanger pad 64, improving heat transfer efficiency.

To distribute the load placed on the heat exchangers 60 by the fasteners 70, a support bar 82 is provided. Fasteners 70 extend through apertures 84 in support bars 82 and may be secured by a nut or similar device. Since fasteners 70 are secured at the ends of the support bars 82, there may be come bowing of the bars 82. To compensate for this bowing and provide a better force distribution, spot shims 86 are positioned at approximately the middle of the bars 82 between each bar 82 and the base 62 of each heat exchanger 60.

As best illustrated in FIG. 4, a thermal short circuit between each heat exchanger 60 and coupling pad 46 is further reduced by an insulation void 88 around each fastener 70.

Figure 8:
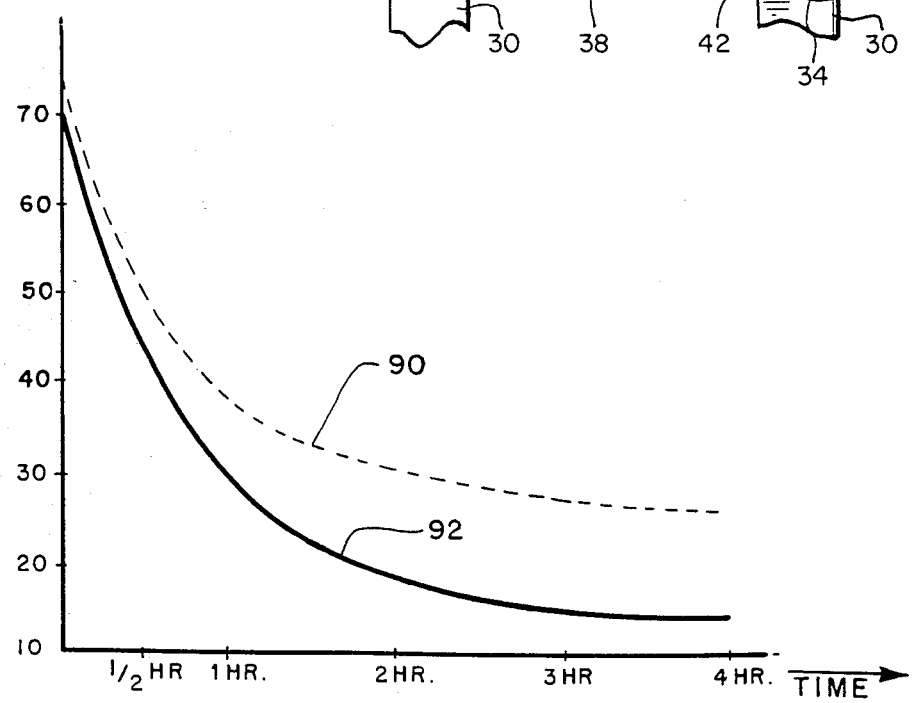
FIG. 8 is a graph illustrating the cooling rate of the cooler of the present invention.

The utilization of the individual coupling pads 46 (in the embodiment illustrated the preferred number is six pads) and the improved hot and cold interfaces between the modules 44 and the pads 46 and between the modules 44 and the heat exchanger 60 results in a cooler 10 that substantially out-performs existing thermoelectric coolers. As graphically illustrated in FIG. 8, the cooling rate of existing coolers is represented by the dotted line 90 and the cooling rate of cooler 10 is illustrated by the solid line 92. Temperature is set forth on the vertical axis and time is plotted on the horizontal axis. As illustrated, cooler 10 cools compartment 14 to a lower temperature more rapidly than existing coolers.

Many modifications and variations of the present invention are possible in light of the above teachings. Thus, it is to be understood that, within the scope of the appended claims, the invention may be practiced other than as specifically described.

What is claimed and desired to be secured by Letters Patent of the United States is:

1. A thermoelectric cooler, comprising:
   a storage compartment for the storage of items therein,
   at least one, separate, detached coupling pad fabricated of thermoconductive material,
   means for attaching said coupling pad onto said storage compartment,
   a thermoelectric module secured to said pad with the cold face of said module against said pad; and
   means mounting a heat exchanger on the hot face of said module in heat transfer relationship comprising;
   at least two fasteners, a support bar and a spot shim between said heat exchanger and said support bar.

2. The cooler set forth in claim 1 wherein said coupling pad is substantially the same size as said thermoelectric module.

3. The cooler set forth in claim 1 wherein said heat exchanger comprises a plurality of aluminum extruded fins wherein each fin is spaced from an adjacent fin by a predetermined distance to maximize heat transfer, said spacing defining an interfin base.

4. The cooler set forth in claim 3 wherein said mounting means further comprises;
   means mounting said heat exchanger on said coupling pad; and
   an insulating bushing between said fastener and said coupling pad, and resilient means on said fastener between said bushing and said coupling pad, wherein compressive forces between said module and coupling pad are controlled.

5. The cooler set forth in claim 4 further comprising an insulating void around a portion of said fastener adjacent said storage compartment.

6. An assembly for coupling a thermoelectric module in energy transfer relationship with a storage compartment, said assembly comprising;
   a coupling pad substantially the same size as said thermoelectric module,
   means for securing said coupling pad and said thermoelectric module to said storage compartment, and
   a support bar and spot shim for use with said securing means to secure said heat exchanger to said coupling pad and said thermoelectric module.

7. The assembly set forth in claim 6 further comprising a heat exchanger including a plurality of extruded aluminum fins spaced a predetermined distance apart from each other.

8. The assembly set forth in claim 6 wherein said securing means includes at least one fastener, and insulating bushing on said fastener and a Belleville washer surrounding said fastener.

* * * * *